(12) United States Patent
Kim

(10) Patent No.: US 7,187,122 B2
(45) Date of Patent: Mar. 6, 2007

(54) ACTIVE MATRIX ELECTROLUMINESCENCE DEVICE HAVING A METALLIC PROTECTIVE LAYER AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 162 days.

(21) Appl. No.: 10/836,348

(22) Filed: May 3, 2004

(65) Prior Publication Data
US 2004/0256985 A1    Dec. 23, 2004

(30) Foreign Application Priority Data
Jun. 23, 2003   (KR)  ............... 10-2003-0040712

(51) Int. Cl.
*H05B 33/00* (2006.01)

(52) U.S. Cl. ................. 313/506; 313/503; 445/24

(58) Field of Classification Search ......... 313/489–509
See application file for complete search history.

(56) References Cited

U.S. PATENT DOCUMENTS

2002/0038998 A1   4/2002   Fujita et al.
2003/0058376 A1*  3/2003   Zhang ...................... 349/43
2003/0214248 A1   11/2003  Jinno
2004/0012549 A1*  1/2004   Nishikawa ................ 345/76
2004/0080276 A1   4/2004   Ito
2004/0109218 A1*  6/2004   Kobayashi ............... 359/245

* cited by examiner

*Primary Examiner*—Joseph Williams
*Assistant Examiner*—Bumsuk Won
(74) *Attorney, Agent, or Firm*—Fleshner & Kim, LLP

(57) ABSTRACT

An active matrix electroluminescence display device and a method for fabricating the same, whereby damage caused by UV light rays during the fabrication process can be prevented, are disclosed. The active matrix electroluminescence display device includes a plurality of transistors formed on a substrate having an emissive area and a non-emissive area defined thereon, an insulating layer formed on the substrate and the thin film transistors, a metallic protective layer formed on the insulating layer of the non-emissive area, a first electrode formed on the insulating layer of the emissive area, an electroluminous layer formed on the first electrode, and a second electrode formed on the electroluminous layer.

32 Claims, 5 Drawing Sheets

Light

Light

US 7,187,122 B2

ACTIVE MATRIX ELECTROLUMINESCENCE DEVICE HAVING A METALLIC PROTECTIVE LAYER AND METHOD FOR FABRICATING THE SAME

CROSS-REFERENCE TO RELATED APPLICATIONS

This application claims the benefit of Korean Application No. P2003-040712, filed on Jun. 23, 2003, which is hereby incorporated by reference as if fully set forth herein.

BACKGROUND OF THE INVENTION

1. Field of the Invention

The present invention relates to an electroluminescence device, and more particularly, to an active matrix electroluminescence device and a method for fabricating the same. Although the present invention is suitable for a wide scope of applications, it is particularly suitable for preventing damage caused by UV light rays during the fabrication process.

2. Discussion of the Related Art

An electroluminescence device is being viewed as a next generation flat display device for its characteristics of a wide viewing angle, a high aperture ratio, and a high chromaticity. More specifically, in an organic electroluminescence (EL) device, when an electric charge is injected into an organic electroluminous (EL) layer formed between a hole injection electrode and an electron injection electrode, the electron and the hole are paired to each other generating an exciton, the excited state of which falls to a ground state, thereby emitting light. Thus, the organic electroluminescence device (ELD) can be operated at a lower voltage, as compared to other display devices.

Depending upon the driving method, the organic ELD can be classified into a passivation ELD and an active matrix ELD. The passivation ELD is formed of a transparent electrode on a transparent substrate, an organic EL layer on the transparent electrode, and a cathode electrode on the organic EL layer. The active matrix ELD is formed of a plurality of scan lines and data lines defining a pixel area on a substrate, a switching device electrically connecting the scan lines and the data lines and controlling the electroluminescence device, a transparent electrode (i.e., anode) electrically connected to the switching device and formed in the pixel area on the substrate, an organic EL layer on the transparent electrode, and a metal electrode (i.e., cathode) on the organic EL layer. Unlike the passivation ELD, the active matrix ELD further includes the switching device, which is a thin film transistor (TFT).

However, in the related art fabricating method, UV light rays are used to carry out a surface treatment process both prior to and after forming the organic EL layer. During the process, the UV light rays cause damages on devices, such as the thin film transistor. More specifically, such damages mainly occur in devices that are not in the emissive area, such as a gate driver or a data driver.

SUMMARY OF THE INVENTION

Accordingly, the present invention is directed to an active matrix electroluminescence device and a method for fabricating the same that substantially obviate one or more problems due to limitations and disadvantages of the related art.

An object of the present invention is to provide an active matrix electroluminescence device and a method for fabricating the same, which can enhance the reliability of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an active matrix electroluminescence display device includes a plurality of transistors formed on a substrate having an emissive area and a non-emissive area defined thereon, an insulating layer formed on the substrate and the thin film transistors, a metallic protective layer formed on the insulating layer of the non-emissive area, a first electrode formed on the insulating layer of the emissive area, an electroluminous layer formed on the first electrode, and a second electrode formed on the electroluminous layer.

Herein, the metallic protective layer is formed either on an entire surface or a predetermined area of the insulating layer of the non-emissive area. When the metallic protective layer and the first electrode are formed of the same material, the metallic protective layer and the first electrode are formed of an opaque metal. Conversely, when the metallic protective layer and the first electrode are formed of a different material, the metallic protective layer is formed of an opaque metal, and the first electrode is formed of a transparent metal.

In order to prevent a capacitance with the thin film transistors from occurring, the metallic protective layer is electrically connected to one of a gate pad and a data pad.

In another aspect of the present invention, a method for fabricating an active matrix electroluminescence display device includes forming a plurality of transistors on a substrate having an emissive area and a non-emissive area defined thereon, forming an insulating layer on the substrate and the thin film transistors, forming a metallic protective layer on the insulating layer of the non-emissive area, and forming a first electrode on the insulating layer of the emissive area, forming an electroluminous layer on the first electrode, and forming a second electrode on the electroluminous layer.

Herein, a metallic material layer is formed on an entire surface of the insulating layer, the metallic material layer then being selectively removed, so as to simultaneously form the first electrode and the metallic protective layer. Or, by using different materials, the first electrode and the metallic protective layer are formed non-simultaneously.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1A:
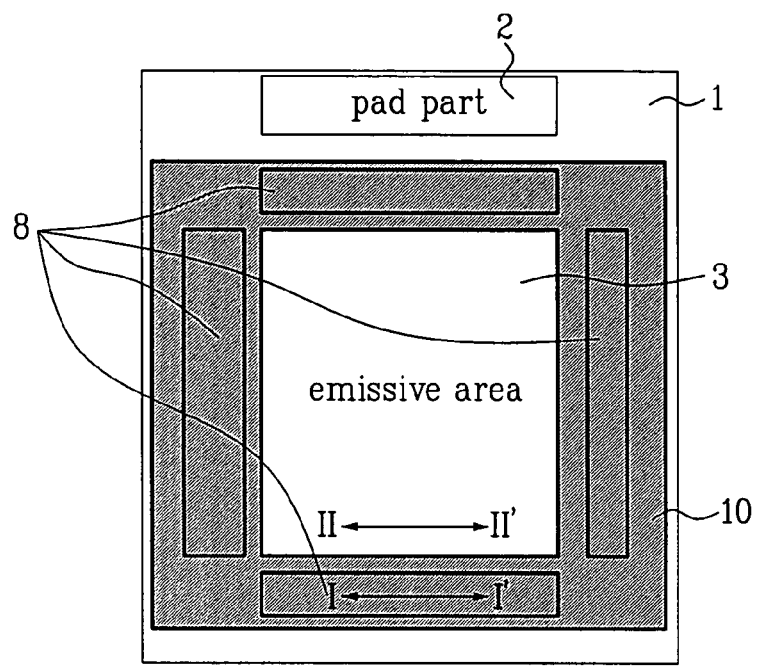
FIGS. 1A to 1C illustrate a plane view and cross-sectional views of an active matrix electroluminescence device according to a first embodiment of the present invention.
Figure 1B:
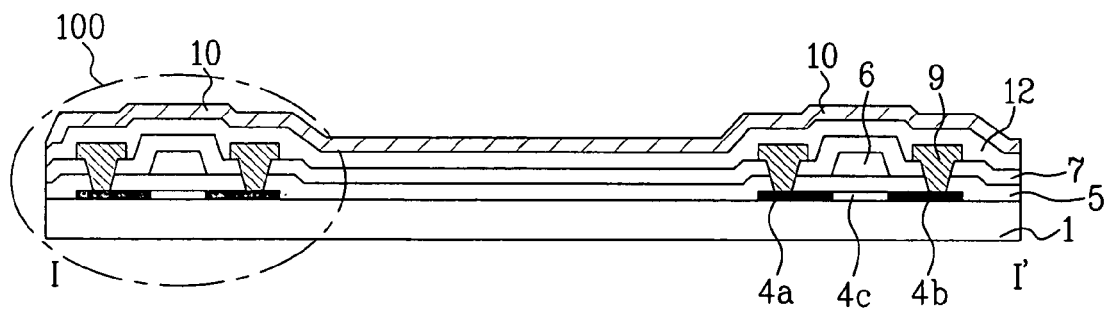
Figure 1C:
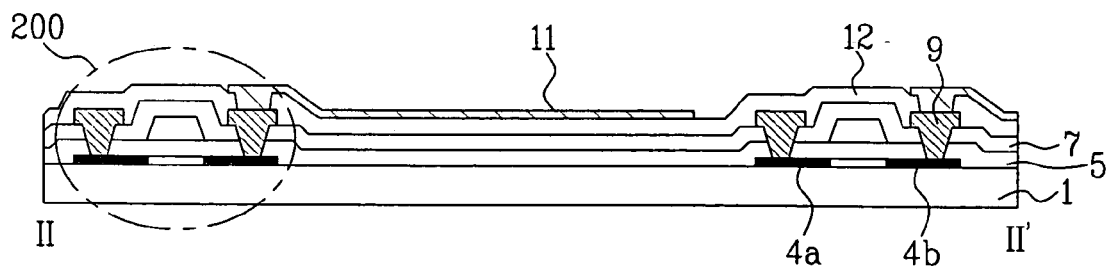

FIGS. 1A to 1C illustrate a plane view and cross-sectional views of an active matrix electroluminescence device according to a first embodiment of the present invention.

Referring to FIG. 1A, a pad part 2, an emissive area 3, and a circuit part 8 are formed on a substrate 1. Herein, the pad part 2 is formed of a gate pad, a data pad, and so on, and the emissive area 3 is formed of a plurality of pixels. In addition, the circuit part 8 is formed on a non-emissive area as a gate driver or a data driver.

In addition, the active matrix electroluminescence device according to the first embodiment of the present invention also includes a metallic protective layer 10 formed on the circuit part 8 outside of the emissive area 3, so as to prevent damages caused by the UV light rays from occurring in the circuit part 8. The metallic protective layer 10 is formed on the area excluding the pad part 2 and the emissive area 3 of the substrate 1.

The method for fabricating the active matrix electroluminescence device according to the first embodiment of the present invention will now be described in detail.

Referring to FIGS. 1B and 1C, a plurality of thin film transistors 100 and 200 are formed on a glass substrate 1. The thin film transistor 200 formed within the emissive area 3 acts as a switch for controlling each pixel, and the thin film transistor 100 formed outside of the emissive area 3 acts as a gate driver or a data driver. Herein, the thin film transistors 100 and 200 are formed of source and drain electrodes 4a and 4b, a channel area 4c, a gate insulating layer 5, and a gate electrode 6.

Thereafter, an interlayer dielectric 7 is formed on the gate insulating layer 5 and the gate electrode 6. Then, the interlayer dielectric 7 and the gate insulating layer 5 are selectively etched, so as to expose a predetermined portion of the surface of the source and drain electrodes 4a and 4b, thereby forming a plurality of contact holes. The contact holes are then filled with a metal, thereby forming a plurality of electrode lines 9 each electrically connected to the source and drain electrodes 4a and 4b.

Subsequently, an insulating material (e.g., a $SiN_x$ group or $SiO_x$ group material) is deposited on the interlayer dielectric 7 and the electrode lines 9, thereby forming a protective layer 12. And, as shown in FIG. 1A, the metallic protective layer 10 is formed on an area excluding the pad part 2 and the emissive area 3. In other words, the metallic protective layer 10 is formed on the periphery of the emissive area 3. There is a plurality of methods for selectively forming the metallic protective layer 10. For example, a metal layer is formed on the entire surface of the protective layer 12, and then, the metallic protective layer 10 may be formed by selectively removing the metal layer on the emissive area 3 and the pad part 2. The metallic protective layer 10 may also be selectively deposited on the protective layer 12 by using a mask. Herein, the metallic protective layer 10 is formed of one of or an alloy of chrome (Cr), copper (Cu), tungsten (W), gold (Au), nickel (Ni), silver (Ag), titanium (Ti), and tantalum (Ta).

Also, in order to reduce the capacitance occurring between the metallic protective layer 10 and the thin film transistor 100, the metallic protective layer 10 is electrically connected to the pad part 2 through a lining.

Moreover, referring to FIG. 1C, the protective layer 12 is selectively removed, so as to expose the electrode line 9 connected to the drain electrode 4b within the emissive area 3. Herein, contact holes are formed in the area where the protective layer 12 is selectively removed. Subsequently, a metal is deposited on the entire surface of the protective layer 12, so as to form a pixel electrode 11. In the bottom-emission electroluminescence device, the pixel electrode 11 is formed of a transparent material, such as indium-tin-oxide (ITO). Conversely, in the top-emission electroluminescence device, the pixel electrode 11 is formed of a metal having high reflectivity and work function. The pixel electrode 11 is formed only in the pixel area within the emissive area and is connected to the electrode line 9 within the emissive area. Herein, the pixel electrode 11 is formed either before forming the metallic protective layer 10, or after forming the metallic protective layer 10.

Figure 5A:
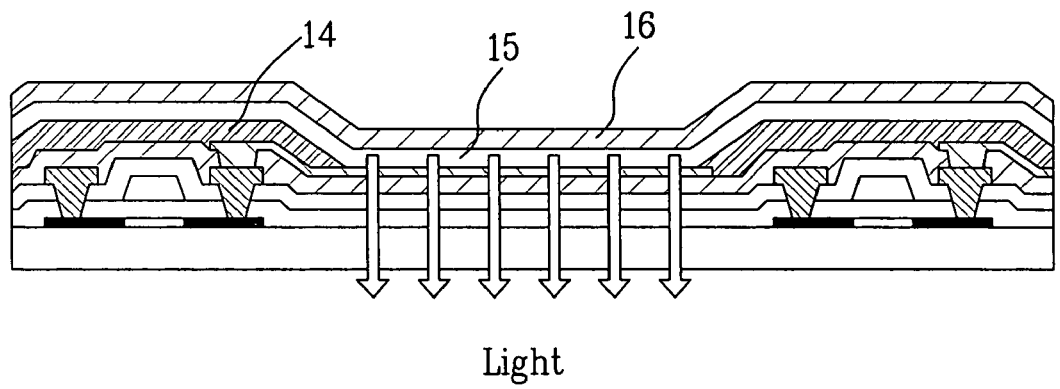
FIGS. 5A and 5B illustrate cross-sectional views of the active matrix electroluminescence device according to the present invention.

Thereafter, as shown in FIG. 5A, after depositing an insulating material on the entire surface of the pixel electrode 11 and the protective layer 12, the insulating material layer is selectively removed, so as to form an insulating layer 14 on the area excluding the pixel area, which is the boundary area between each pixel area. The insulating layer 14 is formed above the thin film transistor 200 of the emissive area. Subsequently, an organic electroluminous (EL) layer 15 is formed on the pixel electrode 11 by using a shadow mask (not shown), and a common electrode 16 is formed on the organic EL layer 15 and the insulating layer 14.

Although not shown in the drawings, a protective layer (not shown) is formed to protect the organic EL layer 15 from oxygen or moisture. Finally, a protective cap is formed by using a sealant and a transparent substrate.

Second Embodiment

Figure 2A:
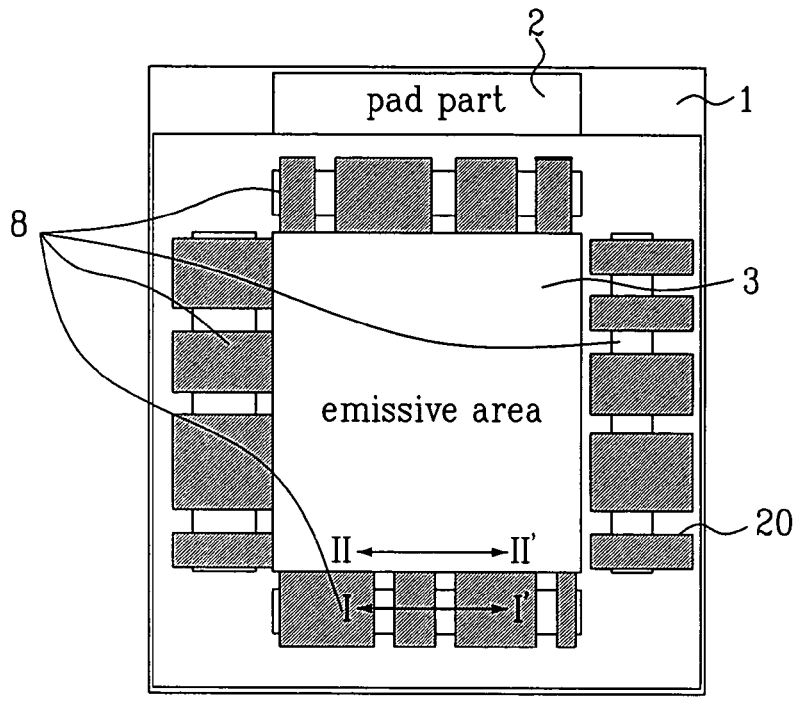
FIGS. 2A to 2C illustrate a plane view and cross-sectional views of the active matrix electroluminescence device according to a second embodiment of the present invention.
Figure 2B:
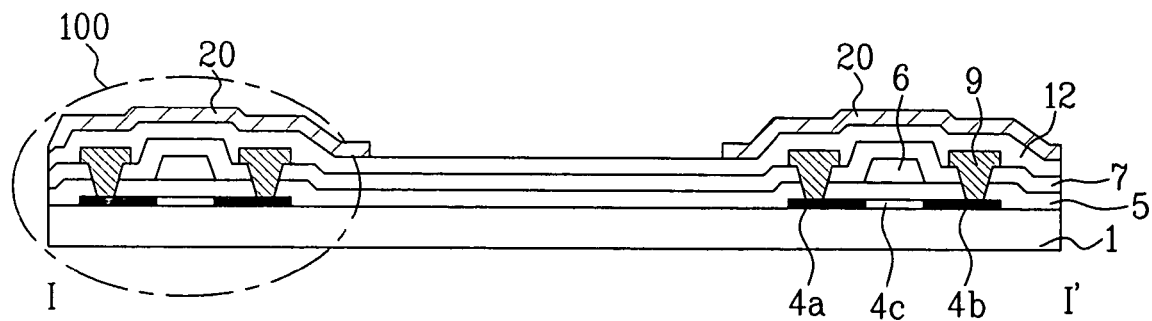
Figure 2C:
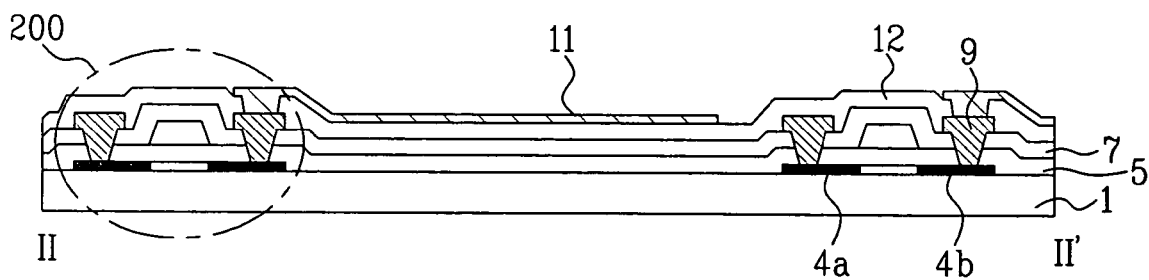

FIGS. 2A to 2C illustrate a plane view and cross-sectional views of the active matrix electroluminescence device according to a second embodiment of the present invention.

Referring to FIG. 2A, a pad part 2, an emissive area 3, and a circuit part 8 are formed on a substrate 1.

In addition, the active matrix electroluminescence device according to the second embodiment of the present invention also includes a metallic protective layer 20 formed on the circuit part 8 outside of the emissive area 3, so as to prevent damages caused by the UV light rays from occurring in the circuit part 8. Referring to FIG. 2B, the metallic protective layer 20 is selectively formed only on the devices, such as the thin film transistor 100, which are formed outside of the emissive area 3.

With the exception of the metallic protective layer 20, the structure of the second embodiment is the same as that of the first embodiment.

Third Embodiment

Figure 3A:
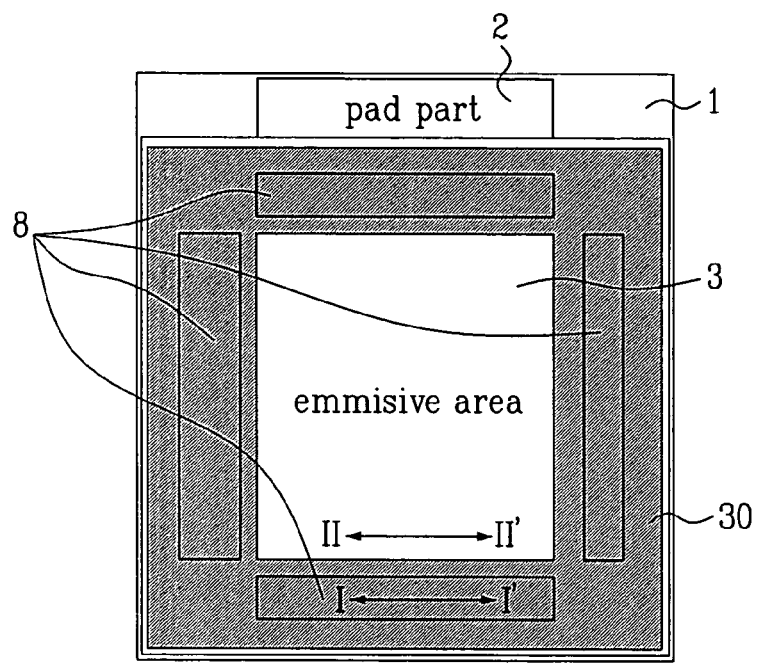
FIGS. 3A to 3C illustrate a plane view and cross-sectional views of an active matrix electroluminescence device according to a third embodiment of the present invention.
Figure 3B:
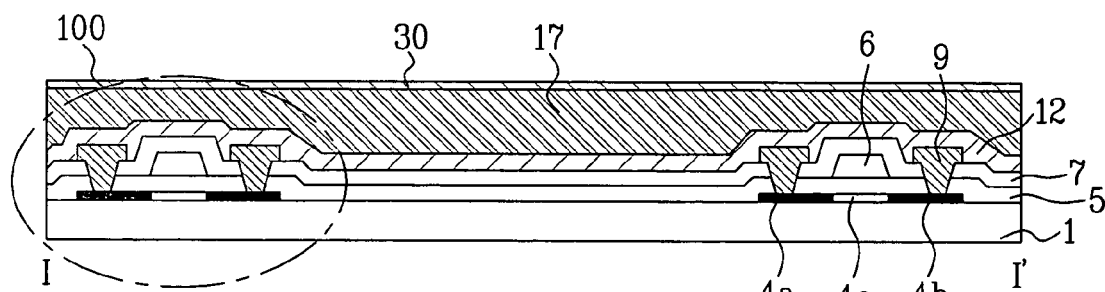
Figure 3C:
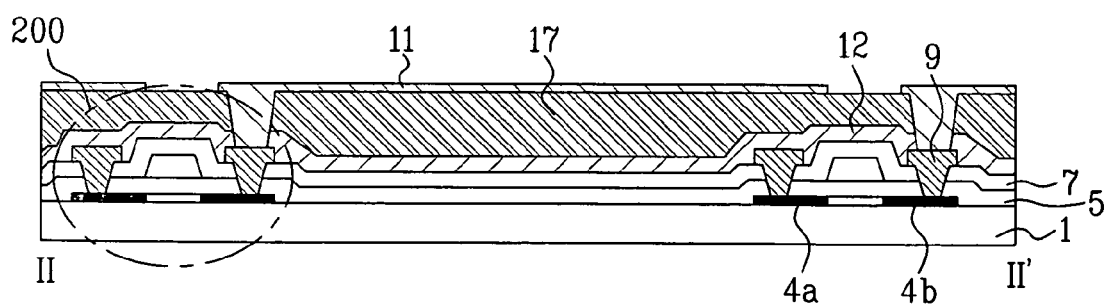

FIGS. 3A to 3C illustrate a plane view and cross-sectional views of an active matrix electroluminescence device according to a third embodiment of the present invention.

Referring to FIG. 3A, a pad part 2, an emissive area 3, and a circuit part 8 are formed on a substrate 1.

In addition, the active matrix electroluminescence device according to the third embodiment of the present invention also includes a metallic protective layer 30 formed on the circuit part 8 outside of the emissive area 3, so as to prevent damages caused by the UV light rays from occurring in the circuit part 8. Herein, the metallic protective layer 30 is formed only on a region outside of the pad part 2 and the emissive area 3.

The method for fabricating the active matrix electroluminescence device according to the third embodiment of the present invention will now be described.

Referring to FIGS. 3B and 3C, a plurality of thin film transistors 100 and 200 is formed on the glass substrate 41. The thin film transistor 200 formed within the emissive area 3 acts as a switch for controlling each pixel, and the thin film transistor 100 formed outside of the emissive area 3 acts as a gate driver or a data driver. Herein, the thin film transistors 100 and 200 are formed of source and drain electrodes 4a and 4b, a channel area 4c, a gate insulating layer 5, and a gate electrode 6.

Thereafter, an interlayer dielectric 7 is formed on the gate insulating layer 5 and the gate electrode 6. Then, the interlayer dielectric 7 and the gate insulating layer 5 are selectively etched, so as to expose a predetermined portion of the surface of the source and drain electrodes 4a and 4b, thereby forming a plurality of contact holes. The contact holes are then filled with a metal, thereby forming a plurality of electrode lines 9 each electrically connected to the source and drain electrodes 4a and 4b.

Then, an insulating material (e.g., a $SiN_x$ group or $SiO_x$ group material) is deposited on the interlayer dielectric 7 and the electrode lines 9, thereby forming a protective layer 12. Then, a planarization overcoat 17 is formed on the protective layer 12.

Subsequently, a metallic material layer is deposited on the planarization overcoat 17, and the metallic material layer is selectively removed, so as to simultaneously form the pixel electrode 11 and the metallic protective layer 30 of the same material. The pixel electrode 11 is formed only on the pixel area within the emissive area 3 and is connected to the electrode line 7 within the emissive area 3. The metallic protective layer 30 is formed in the area excluding the emissive area 3 and the pad part 2, as shown in FIG. 3A. More specifically, the metallic protective layer 30 is formed on the periphery of the emissive area 3. Herein, the pixel electrode 11 and the metallic protective layer 30 are formed of one of or an alloy of chrome (Cr), copper (Cu), tungsten (W), gold (Au), nickel (Ni), silver (Ag), titanium (Ti), and tantalum (Ta).

Also, in order to reduce the capacitance occurring between the metallic protective layer 30 and the thin film transistor 100, the metallic protective layer 30 is electrically connected to the pad part 2 through a lining.

Figure 5B:
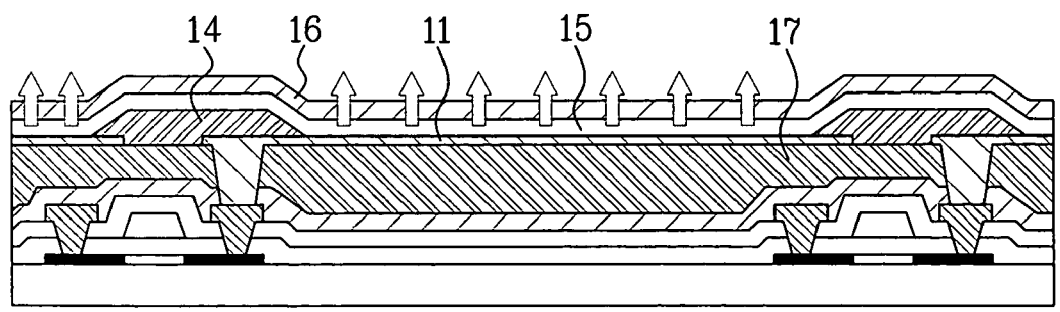

Furthermore, as shown in FIG. 5B, after depositing an insulating material on the entire surface of the pixel electrode 11 and the planarization overcoat 17, the insulating material layer is selectively removed, so as to form an insulating layer 14 on the area excluding the pixel area, which is the boundary area between each pixel area. Subsequently, an organic electroluminous (EL) layer 15 is formed on the pixel electrode 11 by using a shadow mask (not shown), and a common electrode 16 is formed on the organic EL layer 15 and the insulating layer 14.

Fourth Embodiment

Figure 4A:
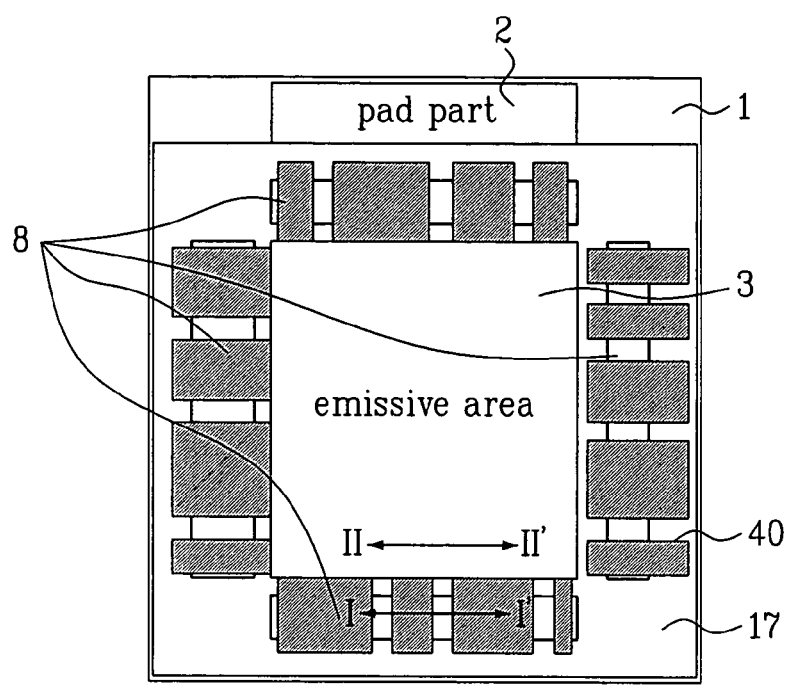
FIGS. 4A to 4C illustrate a plane view and cross-sectional views of an active matrix electroluminescence device according to a fourth embodiment of the present invention.
Figure 4B:
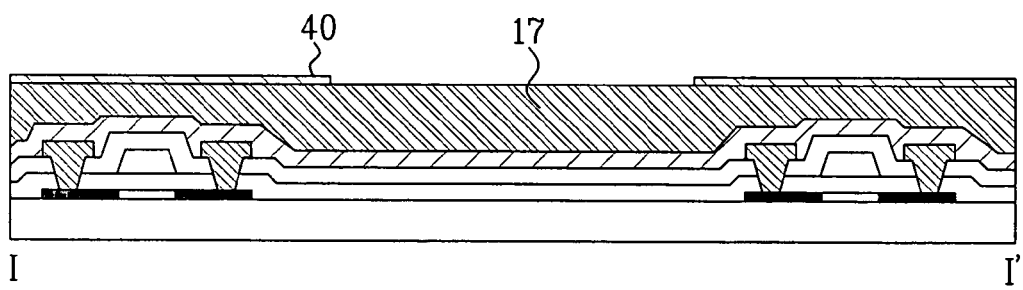
Figure 4C:
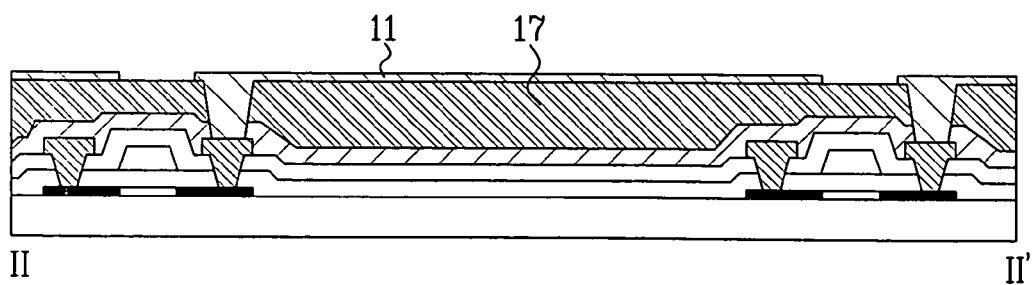

FIGS. 4A to 4C illustrate a plane view and cross-sectional views of an active matrix electroluminescence device according to a fourth embodiment of the present invention.

Referring to FIG. 4A, a pad part 2, an emissive area 3, and a circuit part 8 are formed on a substrate 1.

In addition, the active matrix electroluminescence device according to the fourth embodiment of the present invention also includes a metallic protective layer 40 formed on the circuit part 8 outside of the emissive area 3, so as to prevent damages caused by the UV light rays from occurring in the circuit part 8. Referring to FIG. 4B, the metallic protective layer 40 is selectively formed only on the devices, such as the thin film transistor 100, which are formed outside of the emissive area 3. Herein, the metallic protective layer 40 is formed of the same material as that of the pixel electrode 11.

With the exception of the metallic protective layer 40, the structure of the fourth embodiment is the same as that of the third embodiment.

In the aforementioned active matrix electroluminescence display device and the method for fabricating the same, the metallic protective layer is formed on devices outside of the emissive area, such as the thin film transistor, so as to prevent damage caused by the UV light rays from occurring during the fabrication process, thereby providing a highly reliable device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An active matrix electroluminescence display device, comprising:
   a plurality of transistors formed on a substrate having an emissive area and a non-emissive area defined thereon;
   an insulating layer formed on the substrate and the transistors;
   a metallic protective layer formed on the insulating layer entirely over one or more transistors of the non-emissive area and not over switching transistors of the emissive area that control emission of light from pixels of the display device;
   a first electrode formed on the insulating layer of the emissive area;
   an electroluminous layer formed on the first electrode; and
   a second electrode formed on the electroluminous layer, wherein the metallic protective layer is electrically coupled to a circuit to reduce capacitance between the metallic protective layer and the one or more transistors covered by the metallic protective layer.

2. The device according to claim 1, wherein the metallic protective layer is formed on a predetermined area of the insulating layer formed on thin film transistors corresponding to the one or more transistors of the non-emissive area.

3. The device according to claim 1, wherein the metallic protective layer and the first electrode are formed of a same material.

4. The device according to claim 3, wherein the metallic protective layer and the first electrode are formed of at least one of chrome (Cr), copper (Cu), tungsten (W), gold (Au), nickel (Ni), silver (Ag), titanium (Ti), or tantalum (Ta).

5. The device according to claim 1, wherein the metallic protective layer and the first electrode are formed of a different material.

6. The device according to claim 5, wherein the metallic protective layer is formed of an opaque metal, and the first electrode is formed of a transparent metal.

7. The device according to claim 1, wherein the metallic protective layer is electrically connected to one of a gate pad and a data pad.

8. The device according to claim 1, wherein the first electrode is connected to a thin film transistor of the emissive area through a contact hole penetrating the insulating layer.

9. The device according to claim 1, further comprising:
another insulating layer on a predetermined area of the insulating layer and the first electrode formed on thin film transistors of the emissive area.

10. The device according to claim 1, wherein the one or more transistors covered by the metallic protective layer in the non-emissive area are gate driver or data driver transistors.

11. The device according to claim 1, wherein the metallic protective layer lies outside a boundary that defines the emissive area.

12. The device according to claim 1, wherein the metallic protective layer is made of a material which blocks ultraviolet rays.

13. The device according to claim 1, wherein said circuit includes a pad located in outside of the emissive area.

14. The device according to claim 1, wherein the metallic protective layer is not formed over locations in the non-emissive area that do not include the one or more transistors.

15. The device according to claim 1, further comprising:
a planarization layer between the metallic protective layer and the one or more transistors of the non-emissive area.

16. The device according to claim 15, wherein the planarization layer extends into the emissive area at a position over the switching transistors.

17. A method for fabricating an active matrix electroluminescence display device, comprising:
forming a plurality of transistors on a substrate having an emissive area and a non-emissive area defined thereon;
forming an insulating layer on the substrate and the transistors;
forming a metallic protective layer on the insulating layer entirely over one or more transistors of the non-emissive area and not over switching transistors of the emissive area that control emission of light from pixels of the display device;
forming a first electrode on the insulating layer of the emissive area;
forming an electroluminous layer on the first electrode; and
forming a second electrode on the electroluminous layer, wherein said method further comprises electrically coupling the metallic protective layer to a circuit to reduce capacitance between the metallic protective layer and the one or more transistors covered by the metallic protective layer.

18. The method according to claim 17, wherein forming the metallic protective layer and the first electrode include:
forming a metallic material layer on an entire surface of the insulating layer;
selectively removing the metallic material layer so as to simultaneously form the first electrode and the metallic protective layer.

19. The method according to claim 18, wherein the metallic protective layer is formed of at least one of chrome (Cr), copper (Cu), tungsten (W), gold (Au), nickel (Ni), silver (Ag), titanium (Ti), or tantalum (Ta).

20. The method according to claim 17, wherein the metallic protective layer is formed on a predetermined area of the insulating layer formed on thin film transistors corresponding to the one or more transistors of the non-emissive area.

21. The method according to claim 17, wherein the metallic protective layer is electrically connected to one of a gate pad and a data pad.

22. The method according to claim 17, further comprising:
forming a contact hole penetrating the insulating layer, so as to expose a portion of a thin film transistor in the emissive area.

23. The method according to claim 17, further comprising:
forming another insulating layer on a predetermined area of the insulating layer and the first electrode on thin film transistors in the emissive area.

24. The method according to claim 17, wherein the first electrode is formed of a transparent material.

25. The method according to claim 17, wherein the metallic protective layer is formed of an opaque material.

26. The method according to claim 17, wherein the one or more transistors covered by the metallic protective layer in the non-emissive area are gate driver or data driver transistors.

27. The method according to claim 17, wherein the metallic protective layer is formed outside a boundary that defines the emissive area.

28. The method according to claim 17, wherein the metallic protective layer is made of a material which blocks ultraviolet rays.

29. The method according to claim 17, wherein said circuit includes a pad located in outside of the emissive area.

30. The method according to claim 17, wherein the metallic protective layer is not formed over locations in the non-emissive area that do not include the one or more transistors.

31. The method according to claim 17, further comprising:
forming a planarization layer between the metallic protective layer and the one or more transistors of the non-emissive area.

32. The method according to claim 31, wherein the planarization layer extends into the emissive area at a position over the switching transistors.

* * * * *